United States Patent [19]

Yoder

[11] Patent Number: 4,929,986
[45] Date of Patent: May 29, 1990

[54] HIGH POWER DIAMOND TRAVELING WAVE AMPLIFIER

[75] Inventor: Max N. Yoder, Falls Church, Va.

[73] Assignee: The United States of America as represented by the Secretary of the Navy, Washington, D.C.

[21] Appl. No.: 101,919

[22] Filed: Sep. 25, 1987

[51] Int. Cl.$^5$ .............................. H01L 29/80
[52] U.S. Cl. ........................ 357/22; 357/16; 357/41; 357/61; 330/311; 330/277
[58] Field of Search ............... 357/16, 22, 41, 61; 330/311, 277

[56] References Cited

U.S. PATENT DOCUMENTS 4,658,220 4/1987 Heston et al. .................. 330/311

FOREIGN PATENT DOCUMENTS 58-141572 8/1983 Japan .
59-213126 12/1984 Japan .
60-246627 12/1985 Japan .

OTHER PUBLICATIONS

Attachment "A" to the Declaration of Max N. Yoder, filed herewith, Applications of Diamond Technology. The distribution of this document is set forth in said declaration.
Attachment "B" to the Declaration of Max. N. Yoder, filed herewith, Soliciting Bid No. N00014-8-6-R-0047, especially internal appendices 1-3 of Attachment B. The distribution of this document is set forth in said declaration.

Primary Examiner—Rolf Hille
Assistant Examiner—Steven Loke
Attorney, Agent, or Firm—Thomas E. McDonnell; Edward F. Miles

[57] ABSTRACT

An FET device especially useful in common gate amplifier circuits used as amplifiers of microwave and millimeter wave signals. The device has a diamond film layer constituting the device's channel. Device geometry is selected so that, in a common gate amplifier circuit, device input and output are impedance matched to avoid phase cancellation between input and output. In one embodiment a boron nitride layer is disposed heteroepitaxially with the diamond channel and separating the channel from the gate. In another embodiment plural such devices are yoked together integrally source to drain in such a manner that charge carriers entering the second and subsequent stages do so at maximum velocity without the need to accelerate from zero or low velocity. The resulting device has a higher power handling capacity, upper frequency range, and dynamic range.

5 Claims, 4 Drawing Sheets

HIGH POWER DIAMOND TRAVELING WAVE AMPLIFIER

Reference is made to my co-pending application "Yoked, Orthogonally Distributed Traveling Wave Amplifier", filed Aug. 27, 1987, Ser. No. 089,892, the disclosure of which is incorporated herein by reference. Reference is also made to co-pending applications, "Yoked Orthogonally Distributed Equal Reactance Non-Coplanar Traveling Wave Amplifier" of Yoder and Morgan, filed Aug. 27, 1987, Ser. No. 095,487; and the application of Robert Markunas et al., filed Sept. 24, 1987, Ser. No. 100,477 Reference is also made to my co-pending application Ser. No. 091,133, filed Aug. 31, 1987.

BACKGROUND OF THE INVENTION

The invention pertains to unipolar amplifier devices especially useful as amplifiers of signals in the microwave to millimeter wave range.

Field Effect Transistors (FET's) are commonly used as amplifiers of high frequency signals, most commonly in common source amplifier circuits. The common source configuration, however, has the inherent drawback that its input and output portions are theoretically impedance mismatched. For this reason, phase cancellation between the input and output occurs unless the length of the device in the direction of wave propagation (orthogonal to current carrier transit) is made a small fraction of a wavelength. This limitation on size inherently limits the power handling capacity of any such amplifier. The common gate amplifier configuration, however, can theoretically have impedance matched input and output portions, and is thus an excellent candidate for use as an amplifier of high frequency signals if provided with FET's that are internally impedence matched. Another limitation on amplifer power capacity is the inherent breakdown voltage of semiconductors, made worse by the peculiar property of some semiconductors to form weak cross bonds at the semiconductor's edge or interface with other non-lattice matched materials. These weakly held interface or surface electrons are much more easily raised from the valence to the conduction band, and in FET's cause breakdown at a much lower voltage than the inherent breakdown voltage of the bulk semiconductor of which the FET's channels are made. Another limitation on power capacity is the low thermal conductivity of many semiconductor materials.

A limitation on the dynamic range of devices of this kind is the inherent breakdown voltage between the FET gate and the FET channel; for isolated gate FET's, the voltage is the breakdown potential of the isolation material.

High frequency semiconductor amplifiers commonly use compounds of elements of column III and column V of the periodic table, such as gallium arsenide and indium phosphide, because of their extremely high maximum steady state drift velocities. Unfortunately, however, this inherent advantage is offset somewhat because the relationship between electric field potential and steady state drift velocity in both gallium arsenide and indium phosphide becomes negative shortly after the velocity peak. Thus semiconductor devices employing either gallium arsenide or indium phosphide require extremely highly doped regions along the path of carrier movement to insure that these carriers entering subsequent gain stages experience no electric field potential sufficiently higher than that corresponding to the maximum drift velocity. This requires slowing, then accelerating, carriers four times per rf cycle, partially offsetting the value of the extremely high maximum drift velocity in these compounds, wasting considerable energy, and creating much excess heat. Moreover, because of the negative differential drift velocity versus electric field slope of these compounds, charge carriers at higher potential may, in fact, be moving slower than carriers at a lower potential, resulting in carrier bunching and the formation of localized dipole domains within the FET channel. To prevent such dipole domains from degrading device operation, the highly doped regions must be doped sufficiently to rapidly collect these domains and quench them.

As with all semiconductor devices, increasing tensile strength can simplify fabrication and make for a much more rugged and marketable product. Additionally, eliminating device parts, and thus the fabrication steps necessary to manufacture these parts, makes such devices simplier and easier to manufacture, and more reliable in the field because the probability of a fatal fabrication error increases with the number of steps necessary to fabricate a device.

Objects of the Invention

Accordingly, an object of the invention is to provide an FET device especially useful in common gate amplifier circuits used to amplify millimeter wave and microwave signals.

Another object of the invention is to provide such a device having a higher frequency range by forming the device's channel of semiconductor material having a relatively high maximum steady state drift velocity.

Another object of the invention is to extend yet further the device's upper frequency range, and the device's dynamic range, by forming the channel of a semiconductor material having no appreciable negative slope in its characteristic curve of electric field intensity versus steady state drift velocity.

Another object of the invention is to extend the device's power handling capacity and dynamic range by forming the device's channel of a material having a high breakdown potential.

Another object of the invention is to further extend the device's power handling capacity by forming a gate isolation layer heteroepitaxially with the channel to insure that the channel's breakdown potential occurs by bulk rather by skin (surface), breakdown.

Another object of the invention is to further increase the device's power handling capacity, and reliability of operation, by making the channel of a material having a relatively small dielectric constant and high thermal conductivity.

Another object of the invention is to further extend the device's dynamic range by forming the gate isolation layer of a material having a high band gap so as to increase the potential at which unwanted gate current occurs.

Another object of the invention is to make the device more rugged by increasing the tensile strength of one or more of the device's semiconductor layers.

Another object of the invention is to provide an integrated configuration wherein charge carriers enter the second and subsequent gain stages at high velocity and without the requirement to accelerate from zero velocity as in other semiconductors.

Another object of the invention is to make the fabrication of the device's gate simpler and more reliable by forming the isolation layer of a material highly resistant to etching, so as to act as a practical etch stop.

In accordance with these and other objects made apparent hereinafter, the invention is an FET device especially useful in a common gate configuration as an amplifier of millimeter wave and microwave signals. The device has a channel made of a thin epitaxial film layer which, because of its high thermal conductivity, high breakdown voltage, and higher tensile strength, provides clearly superior performance. Most importantly, however, semiconductor diamond has a high maximum drift velocity but unlike such semiconductors as gallium arsenide and indium phosphide, the maximum drift velocity in diamond semiconductor remains virtually constant and near its peak value for all measured electric field intensities. Thus unlike FET devices using gallium arsenide or indium phosphide, diamond channel integrally yoked FETs need not have highly doped regions and their attendant disadvantages. In a preferred embodiment, the FET device is made in a single monolith and of a geometry making the device's input portion (source and gate) and output portion (drain and gate) mirror images of one another. With this geometry and the exceptional uniformity of material between the input and output portions obtainable by forming the device in a single monolith, the input and output impedance of the device can be made virtually identical. This insures that the phase velocity of signal propagation in the input and output portions are also virtually identical, eliminating phase cancellation between stages. This enables one to build the device long in the direction of wave propagation making for a much larger device with the attendant increase in power capacity. In one embodiment, the diamond channel and the device gate are separated by a layer of boron nitride heteroepitaxial with the diamond channel. The high band gap of boron nitride increases the breakdown potential between gate and channel at which unwanted gate current occurs, thus increasing the device's dynamic range. The diamond channel and the boron nitride layer, being heteroepitaxial and lattice-matched, have no uncompleted or weakly completed covalent bonds or trapped charges at the diamond channel's edge, insuring that channel breakdown occurs in bulk rather than by skin (surface) breakdown. In another embodiment, plural amplifier devices are yoked together integrally in a single monolith, source to drain, adjacent sources and drains of adjacent stages being made unitary, thus eliminating device parts and shortening the device in the direction of carrier flow. This results in yet further incremental increases in the device's frequency response (primarily by injecting charge carriers at high velocity into second and subsequent stages), as well as simplifying the device's fabrication by eliminating parts.

The invention is more fully understood from the following detailed description of the preferred embodiments, it being understood, however, that the invention is capable of extended application beyond the precise details of the preferred embodiments. Changes and modification can be made that do not affect the spirit of the invention nor exceed its scope, as expressed in the appended claims. Accordingly, the invention is described with particular reference to the accompanying drawings, wherein:

Brief Description of the Drawings

FIG. 4 is a schematic side view of the chamber in cross section.

FIG. 5 is a view similar to that of FIG. 4, showing the reactor in more detail.

Figure 1:
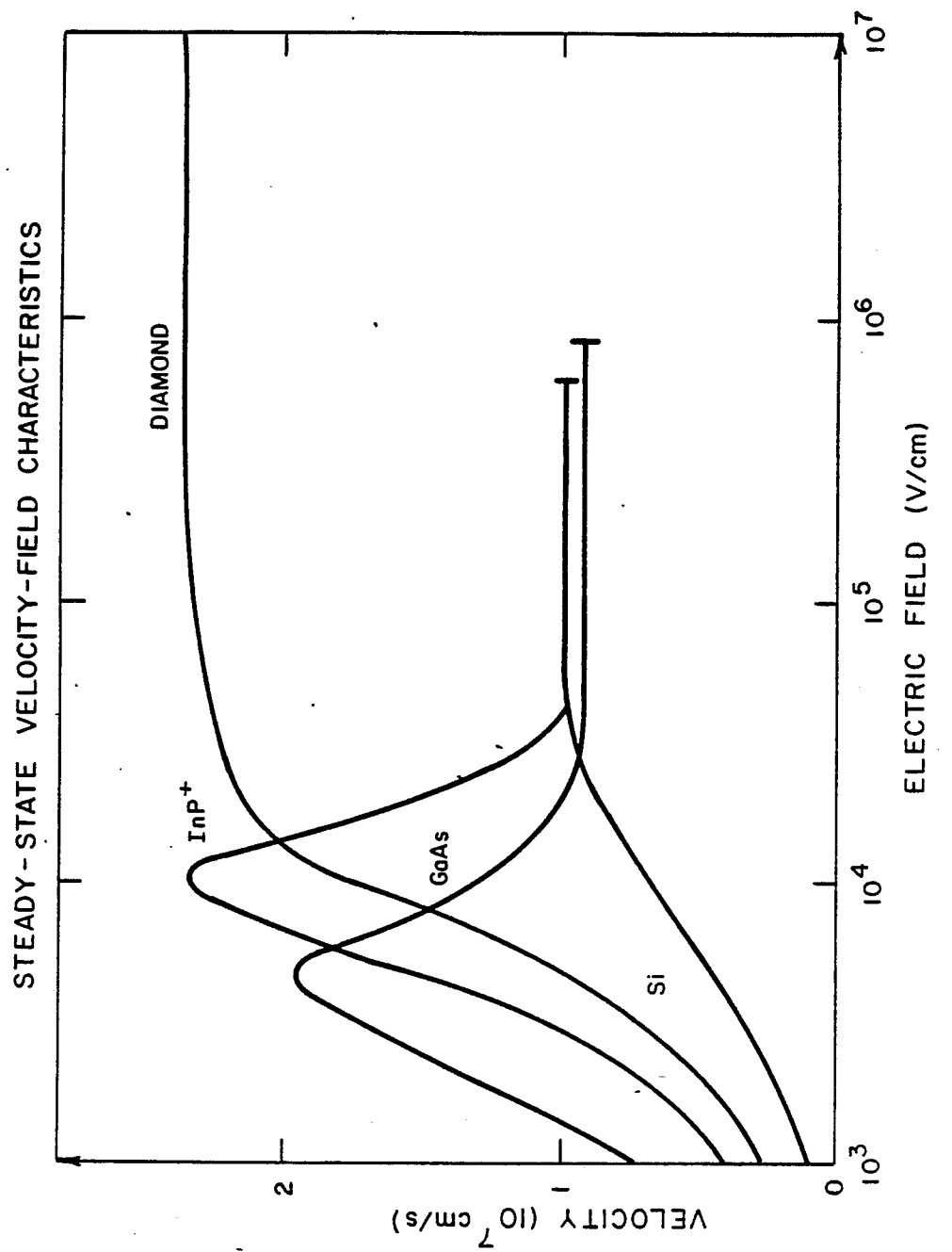
FIG. 1 is a graph showing the relationship between electric field intensity and maximum steady state drift velocity of charged carriers in indium phosphide, gallium arsenide, silicon, and diamond.

Detailed Description of the Invention As is seen in FIG. 1, material such as gallium arsenide and indium phosphide are much better suited to high frequency applications than is silicon because the maximum drift velocities of charge carriers in gallium arsenide and indium phosphide are much higher than silicon.

Unfortunately, unlike silicon, gallium arsenide and indium phosphide's maximum velocities do not remain steady over a wide span of electric field intensity, but rather decline sharply after reaching peak values, at about $3.5 \times (10^3)$ kV/cm for gallium arsenide and about $10^4$ kV/cm. for indium phosphide. Diamond, however, combines the best advantages of both silicon and the column III-V compounds, having a very high maximum drift velocity which remains relatively constant for all measured values of electric field intensity, with no negative fall-off with increasing field intensity.

Figure 2:
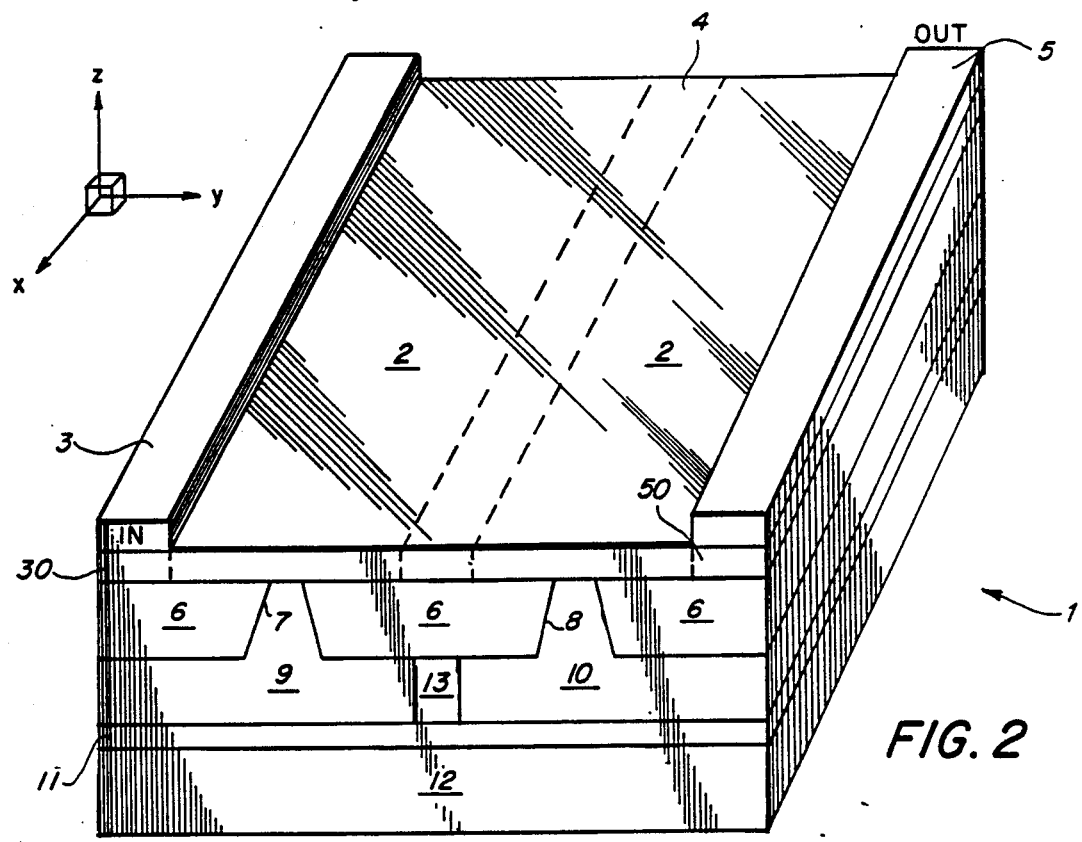
FIG. 2 is an isometric elevated view of a device according to the invention.

With special reference to FIG. 2, a two-stage device according to the invention is shown. (Although two stages are illustrated, it is plain that the advantages of the invention are achieved by a one stage device or a device of three or more stages.) Device 1 has a unitary layer 2 of doped semiconductor diamond epitaxially grown on underlying diamond layer 6. In the preferred embodiments, the diamond is n-doped, although diamond can be advantageously n or p-doped. Overlaying diamond layer 2, are metallic microstrip terminations 3 and 5. Microstrip 3 (along with region 30 of layer 2) corresponds to the source of the first stage of device 1, and 5 (along with region 50) to the drain of device 1's second stage. On the opposite side of layer 2 from microstrips 3, 5 in insulating diamond substrate layer 6. are cut (etched) gate trenches 7, 8 which, when filled with metal, form the gates of the two FET stages. Between gate 9 and gate 10, is an internally formed (deposited nichrome) resistor 13, which serves to set the correct bias point for gate 10 of the second FET stage. Underlaying the metal of gates 9, 10 is dielectric 11 (preferentially deposited boron nitride) which, in turn, is underlain by deposited metal substrate 12, completing the device, In operation, an input signal enters device 1 at the point on microstrip 3 denominated "IN", and propagates along microstrip 3 parallel to the "x" direction illustrated in FIG. 2. The electric field, being transverse to the direction of wave propagation, extends along the "y" and "z" directions causing modulation of charge carrier flow through channels 2. Gates 9 and 10 divide the monolith into the two separate FET gain stages, creating a field node at region 4 equidistant between first stage source 3, 30 and second stage drain 5, 50. Although materially identical to, and unitary with, the remainder of layer 2, region 4 acts as a virtual drain for the first FET stage and virtual source for the second. Each FET stage of device 1 can be viewed as a pair of transmission lines, the source and gate being the input line of the stage, the drain and gate being the output line. Because of the mirror image symmetry between input and output, and the high uniformity of material between corresponding points of the input and output, each stage's input and output are impedance matched. (Although the difference in resistivity between virtual source-drain 4, and heavily doped source 30 and drain 50 will offset this match somewhat, the loss of performance will not be great.) This virtually eliminates phase cancellation between each stage's input and output, and between stages. Because virtual source-drain 4 is internal to device 1, it needs no metalization like 3 and 5, simplifying fabrication of device 1.

It is to be appreciated that charge carriers enter the second gain stage at maximum velocity. Unlike GaAs or InP materials, the electric field need not be reduced between gain stages. The average velocity within the second and subsequent gain stages is thus nearly twice the value if accelerated from zero velocity.

Figure 3:
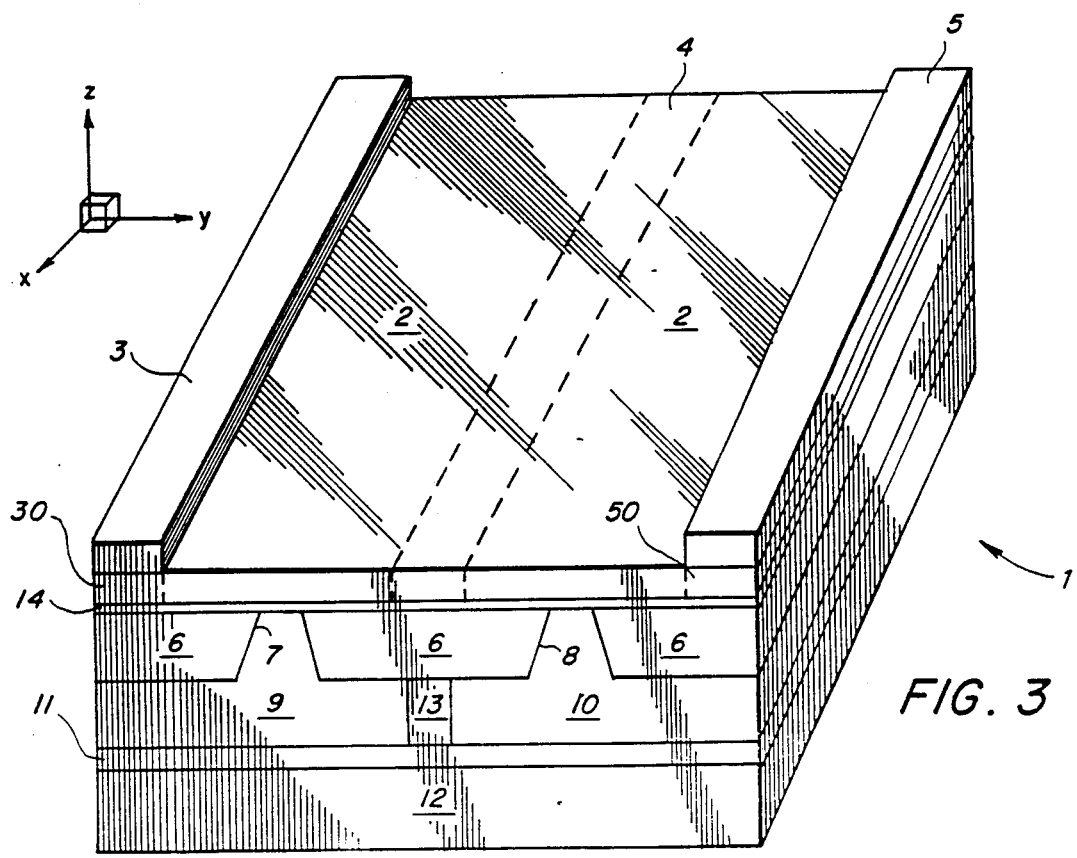
FIG. 3 is a view similar to FIG. 2 showing a variation of the device of FIG. 2.

With particular reference to FIG. 3, a device 1' is shown. Device 1' is like device 1, but with an additional layer 14 of boron nitride disposed between diamond layer 2 and semi-insulating diamond layer 6. Crystalline boron nitride layer 14 is heteroepitaxially grown on diamond layer 6 and diamond layer 2 is heteroepitaxially grown on boron nitride layer 14. The lattice-matched diamond to boron nitride interface precludes trapped charges, which in turn precludes low voltage breakdown in channel interface regions 2. The high bandgap of layer 14 allows much higher input signals to exist between the sources and gates, and the drains and gates, across layer 14 before unwanted gate current arises, thus expanding the device's dynamic range. Layer 14 also enables gate trenches 7 and 8 to be formed more easily and reliably by merely etching in diamond layer 6 until the differentially high etchability of boron nitride halts etching at the boron nitride surface.

Diamond film technology is relatively new. So as to permit a better understanding of the invention, the following description is provided of an apparatus (chemical reactor) and method for producing the kind of diamond films that are discussed above. This method and apparatus are not part of the invention, and are the subject of a separate patent application by Robert Markunas et al. of Research Triangle Institute, Serial No. 100,477, filed Sept. 24, 1987.

The reactor design and operating criteria discussed hereinafter are based on the principle of a remote region of activation of a gas or mixture of gases. The activated gas (gases) then plays several roles leading to the deposition of the semiconducting film. Because of the central importance of "remote region of activation" to the present invention, this terminology is first defined referring to FIG. 4.

Figure 4:
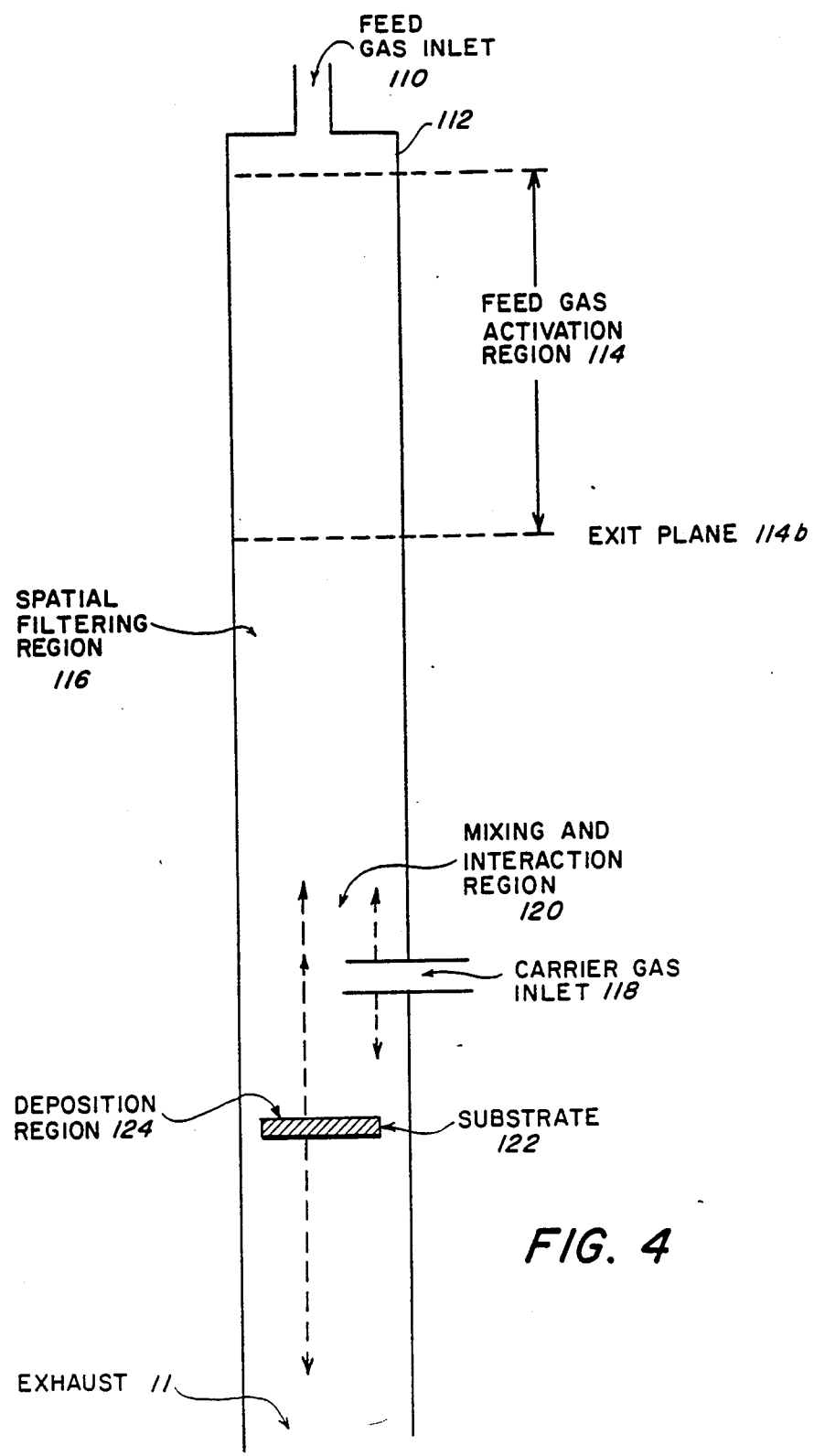
FIGS. 4 and 5 illustrate a reaction chamber used to grow diamond films of the kind used in the devices illustrated in FIGS. 1-3. The subject matter of FIGS. 4 and 5, i.e. apparatus and method of forming diamond films, forms no part of the instant invention, as discussed more fully below.

FIG. 4 shows schematically a section of a flow tube 112. A feed gas stream (single gas, vapor, or mixture) enters at input inlet 110. In the region of activation 114, the feed gas has its chemical reactivity increased. Chemical reactivity of the feed gas can be increased in many ways. For example, one or more components of the feed gas may be ionized; one or more components of the feed gas may be dissociated into more reactive species, such as converting water vapor into hydrogen and oxygen; or the internal energy of the feed gas may be increased without ionization. This can be accomplished by many methods. Some of these methods can be internal to the flow tube. A sample of these internal methods might include heaters, or catalytic surfaces, and electron or ion bombardment sources. Some methods could be external to the flow tube. A sample of these external methods might include broad range optical sources (with an appropriately transparent tube), microwave or radio frequency power sources, or simple heaters. Whatever the feed gas(es), the combined means for activation, or the reactive species formed, in the activation region 114, energy is coupled into one or more gases, and that energy can contribute to subsequent chemical reactions.

Figure 5:
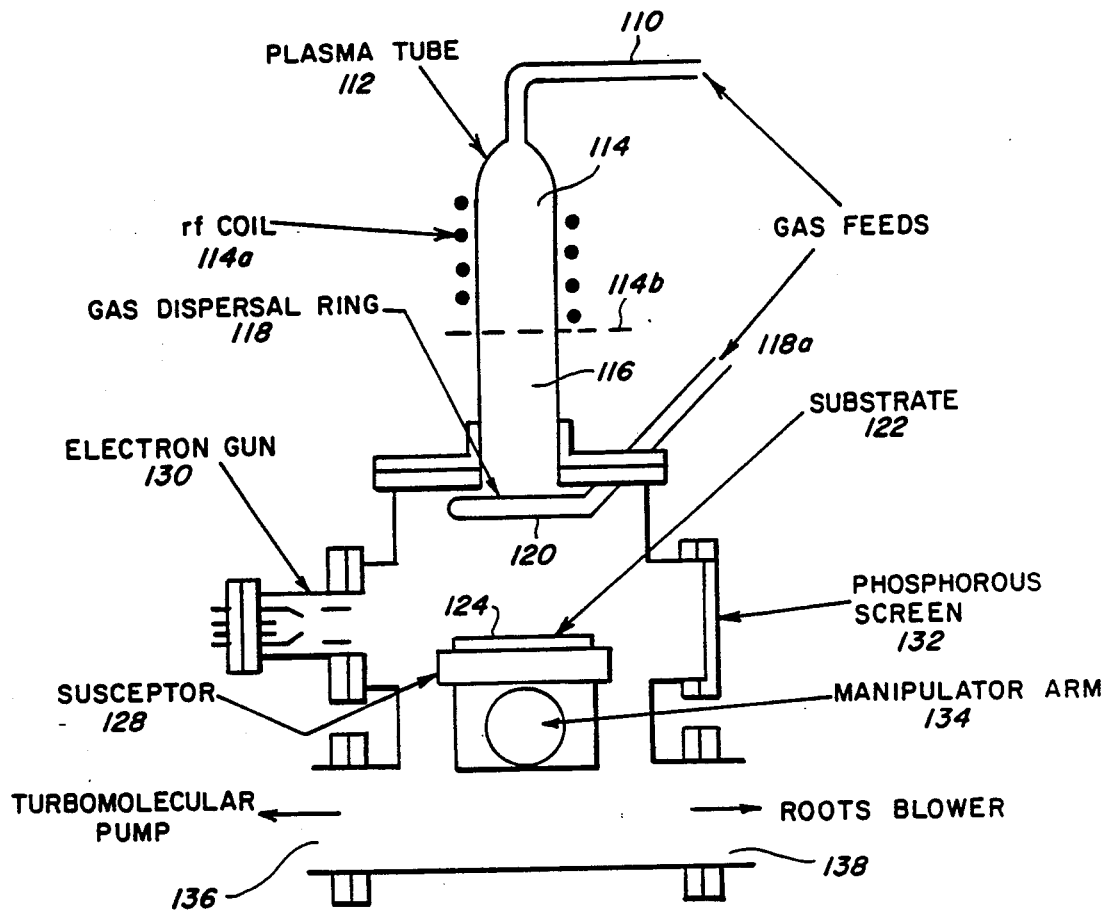

In experimental studies performed to date, an external radio frequency coil 114a, shown in FIG. 5, concentric with the flow tube was used to activate the gas stream.

Referring to FIG. 4, the concept of a "remote" region of activation in the present remote plasma enhanced chemical vapor deposition (RPECVD) technique will be described. By remote region of activation is meant two things: (1) the substrate is not located in a remote region of activation; (2) in any remote region of activation, only gas(es) from the inlet of that region of activation is(are) present, other gas(es) that may be present in other regions of the apparatus can not reach a remote region of activation by diffusion or other processes that would allow such gas(es) to enter through the exit of a region of activation. To ensure this requires both a suitable reactor design and a proper selection of operating parameters. In the flow system, shown in FIGS. 4 and 5, the design of the physical separation of the various regions of the reactor, coupled with the flow velocity of the gas stream (which of course depends on the selection of process parameters) in those regions, determines whether back-diffusion of gases into a region of activation can occur.

As shown in FIG. 4, the system has a feed gas inlet 110 through which a feed gas is entered into a plasma tube 112. In an activation region 114, the chemical reactivity of the feed gas is increased to produce reactive species of the feed gas which pass downstream of the exit plane 114b in the downward direction shown in FIG. 4. Between the exit plane 114b and the carrier gas inlet 118, the feed gas reactive species are filtered such that only the desired specie reaches the gas inlet 118 where it mixes and interacts with a carrier gas introduced via the inlet 118a in a mixing and interaction region 120.

In a working embodiment used to date, a radio frequency coil 114a concentric with the flow tube 112 has been used to create a "plasma" (glow discharge) of the feed gas in the activation region 114. Working examples have used either a pure noble gas plasma feed, as discussed hereinafter, or noble gas mixtures with hydrogen. The plasma environment in the activation region 114 contains many species, even with a simple feed gas like helium. In fact, the feed gas reactive species produced in the activation region 114 include ions, electrons, and a host of excited species all with different composite lifetimes which are influenced by various factors. The flow through the activation region 114 carries the species downstream towards the carrier gas inlet 118 and a substrate 122 mounted in a deposition region 124 downstream of the inlet 118. The distance that the various species can travel before they are annihilated will depend on their composite lifetimes and the flow velocity. The flow velocity of the feed and carrier gases are controlled so as to control the relative abundance of selected or the reacted species at a given distance downstream of the region of activation, such as at the mixing and interaction region 120 and at the carrier gas inlet 118. Thus, by controlling the gas flow rates, and by requiring the reactive species of the feed gas to pass from the exit plane to the mixing and interaction region 120, a spatial filtering region 116 is provided downstream of the exit plane 114b in which undesired reactor species are annihilated and only the selected of the reactive species are passed downstream towards the mixing and interaction region 120.

Spatial filtering as above described involves two aspects. First, some physical distance between the activation region which excites the feed gas and the region where the carrier gas is introduced must exist. And second, the lifetimes of the desired reactive species must be substantially longer than the lifetimes of those species not desired. Once these criteria are established, spatial filtering occurs because the pumping velocity of the reactive species determines how far downstream from the activation region various species will travel before they decay or are annihilated. For example, in a He discharge, electron impact excites He atoms into a host of excited electronic states. These states include $2^3P$, $2^1P$, $3^3S$, $3^1S$, $3^1P$, $3^3P$, $3^1D$, and $3^3D$. All these states all have energies greater than the metastable $2^3S$ state. However, these states quickly decay to the ground state or one of the lower metastable states (e.g. $2^1S$ or $2^3S$) exponentially with a characteristic decay time. This decay time is less than $10^{-7}$ s. As the species are pumped from the discharge regions, the metastables and ground state He atoms are dominant Of the two metastable states, the $2^1S$ state has the shorter decay time or effective lifetime $2\times 10^{-8}$ sec vs $6\times 10^{-3}$ sec for the $2^3S$ state. Thus, the host of highly excited He states in the plasma region have been spatially filtered to produce a desired flux of metastable $2^3S$ He atoms at the entrance to the gas mixing region. The unwanted excited species are completely attenuated exponentially along the length of the spatial filter compared to a factor of 3-150 attenuation (for plug velocities of 10-50 m/sec and spatial filter length of 0.3m) for the desirable metastable specie. For this particular spatial filter design and system operating parameters, all activated gas feed species having effective lifetimes less than $4\times 10^{-3}$ sec will be completely annihilated in the spatial filter.

The spatial filtering region 116 also acts as a backstreaming isolation region which in conjunction with the selected gas flow rates prevents injected carrier gas from the inlet 118 from back diffusing to the exit plane of 114b of the activation region 114.

The flux of activated noble gas species (and by activated it is specifically meant in the sense of internal energy and not kinetic energy) partially dissociates and activates (in the gas phase) the carrier gas. The flux of the activated noble gas species completely reacts and crystallographically orders the activated carrier species onto the substrate 122 and results in the growth of an epitaxial or heteroepitaxial semiconductor on the substrate. The flux of activated spatially filtered noble gas species enhances surface reactivity and reactant surface mobility in the growth of a single crystal epitaxial layer. The technique of the invention can be used in a low pressure process where the mean free path between the exit plane 114b of the activation region 114 and the substrate 122 is such that no gas phase collisions occur.

Reference is made to the schematic of the remote plasma enhanced chemical vapor deposition reactor, shown in FIG. 4. This representation of a RPECVD reactor primarily consists of a plasma tube 112, the region of activation 114, including an activation source such as an rf coil 114a, a gas dispersal ring 118, and the substrate susceptor 128. Additional components include an electron gun 130, phosphorous screen 132, and a manipulator arm 134 used together to perform reflection high energy electron diffraction (RHEED) characterizations of the substrate 122 and the epitaxial semiconductor film deposited thereon. The plasma tube 112 used consists of a 7.6 cm inside diameter pyrex tube. The plasma is driven by a 13.56-MHz rf generator with matching network. The substrates 122 are clamped to a graphite susceptor 128 heated internally by a tungsten halogen lamp (not shown). Substrate temperatures are calibrated using thermocouples (not shown) attached to the surface of a silicon substrate. Gasses are introduced through two separate gas feeds, the plasma feed gas inlet 112 and the carrier gas feed 118a to the gas dispersal ring 118, which serves as the carrier gas feed inlet. The plug velocity of He or other noble gas through the 7.6 cm plasma tube 112 is high enough to prevent back-diffusion of $CH_4$ carrier gases. The plug velocity used is 200 m/s for diamond deposition. Also shown is an outlet 136 for high vacuum pumping via a turbomolecular pump (not shown), an outlet 138 for pumping the process gasses using a roots blower (not shown) together with a direct drive mechanical pump (not shown). Typical pressures are less than $5\times 10^{-10}$ Torr minimum base pressure when the process gasses are not flowing and 1-300 mTorr during epitaxial growth of a semiconductor layer The vacuum intake to the roots blower is ballasted with a constant gas load to prevent antibackstreaming of oil vapors.

Epitaxial growth of diamond may be accomplished by flowing a Noble gas (He, Ar, or Xe) through the plasma tube, and methane, $CH_4$, through the gas dispersal ring. One important factor that distinguishes growth of diamond is the poly-phasic nature of the deposited material. Depending upon the growth conditions, the deposited layers may be diamond, graphite, amorphous or glassy carbon, or mixtures of these materials. When a hydrocarbon such as methane is excited in a plasma, radicals of the form $CH_x$ are formed. As in the silane example, these radicals interact in the gas phase to form carbon-carbon bonds. The added complication in the carbon case results from the ability of carbon to form not one, but three hybridizations. Thus we get carbon-carbon bonding of the ethane form ($sp^3$ hybridization), of the ethylene form ($sp^2$ hybridization), and of the acetylene form ($sp^1$ hybridization). The parallel between these gas phase precursors and their solid phase analogues is striking. Diamond ($sp^3$ hybridization) has ethane type bonding, graphite ($sp^2$ hybridization) has ethylene type bonding, and carbynes (sp hybridization) are chainlike compounds with acetylene type bonding. To grow semiconducting diamond it is necessary to preclude the incorporation of wrong bonds of graphite-like or carbyne-like hybridization. The flux of gaseous precursors with incorrect hybridization onto the film surface is inevitable if the undesirable methane radicals (i.e., the ethylene and carbyne) are formed. Consequently, the design of the growth reactor and the choice of the growth parameters must be properly chosen to form precursors which upon condensation on the substrate promote $sp^3$ hybridization and diamond growth. The growth of diamond proceeds in the following manner. Typically, 500 sccm of He flows through the plasma 23 tube 112 with a 30 sccm dilute mixture of He, $H_2$, and $CH_4$ (4:10:1 by volume) flowing from the gas dispersal ring 118. A rf discharge of 80 W is sustained in the activation region 114 during deposition at a typical pressure of 10 mTorr. The substrate temperature is varied from 650°-850° C. The quartz plasma tube size is 1.5 in. o.d. insuring a high plug velocity necessary for transporting metastables and radicals to the substrate. Using these growth parameters, diamond films have been grown at the rate of approximately 2000 Angstroms per hour.

The proper choice of noble gas and methane diluent is critical for promoting diamond growth. Because the energy of the He metastable is so high (~20 eV), the cross-section for collisional dissociation of the $CH_4$ molecule is low. Thus, the depositional precursor species created by the He are $CH_4+$, $CH_3+$, or $CH_3$, all of which are highly saturated $CH_x$ radicals. The hydrogen serves two roles. First as a source of atomic hydrogen to the nucleating film, it more preferentially etches the graphitic bonds than the diamond bonds Second, it moderates the gas phase chemistry promoting higher saturation of the $CH_x$ radicals.

One of the foremost problems in low temperature chemical vapor deposition is the removal of hydrogen from the nucleating film. For $CH_4$ the spontaneous desorption of hydrogen occurs around 1000° C. Growth of diamond then requires some other process besides thermal desorption to rid the deposited layers of hydrogen. One approach is to supply the surface which some other source of energy, photons, electrons, ions, etc.

One way to do this is to supply a flux of metastables to the deposition surface. The same metastables which dissociate bonds in the gas phase can liberate hydrogen bonded on the nucleating solid. This is accomplished by keeping the carrier gas concentrations low to prevent total quenching of the metastables in the reaction zone. However, because quenching of the metastables is necessary to form precursor species which can deposit at lower temperatures, there is a compromise made between the deposition rate determined by how many metastables are quenched and the dehydrogenation rate determined by how many metastables survive the reaction zone and are incident on the substrate.

One approach uses a sequentially pulsed growth technique where one deposits for some determinant period of time with the carrier gas flowing, removes the carrier gas, and dehydrogenates for some determinant period of time. The grown period is sustained long enough to deposit a monolayer of material. The dehydrogenation period is sustained long enough to rid the deposited monolayer of hydrogen Because the carrier gasses are not quenching the metastable flux, the metastable flux to the surface would be maximum and the hydrogenation time minimized. One might also expect that the metastable flux to the surface to impart energy to the adsorbed atoms and increase their mobility on the growth surface. In general, the higher the surface atom mobility is, the better the crystal will grow. The following are key operating parameters of the pulsed growth sequence technique :

Deposition Sequence
  Ar 200 sccm plasma tube
  Ar 50 sccm ring feed
  $SiH_4$ 10 sccm ring (2% $SiH_4$ in He)
  Pressure 0.200 Torr
  rf power 40W
  substrate temperature 200° C.
  deposition time 1 min
Dehydrogenation Sequence
  Ar 200 sccm plasma tube
  Ar 50 sccm ring feed
  $SiH_4$ 0 sccm ring
  Pressure 0.200 Torr
  rf power 40W
  substrate temperature 200° C.
  dehydrogenation time 30 sec The overall sequence includes repeated alternate performances of the above noted deposition and dehydrogenation sequences.

In any type of epitaxial process the order and cleanliness of the starting surfaces are of paramount importance. This is especially true in any low temperature epitaxial process where adsorbed atoms may not have enough mobility unless the energy is provided by some other source other than thermal. In the RPECVD apparatus and process, two techniques that use the flux of excited or dissociated species from the plasma region to clean substrates of residual contaminants have been developed. The first technique involves dissociation of molecular hydrogen in the plasma region and transport of atomic hydrogen to the substrate surface. There the hydrogen reacts with residual carbon and oxygen atoms forming volatile compounds which leave the surface. Typical operating conditions for this process are 80–100 sccm $H_2$ plasma, 4–5 mTorr, 35 Watts, 300° C. substrate temperature, and 20 s time duration. Because atomic hydrogen may react with the glass walls of the plasma tube, this process has been refined. Now, metastable species of Ar, generated in the plasma region 114, interact with hydrogen flowing from the ring feed 118 to form atomic hydrogen. The plug velocity of the Ar is kept high to prevent hydrogen from back-diffusing into the plasma region. Typical operating conditions for the refined cleaning process are 200 sccm Ar plasma, 50 sccm $H_2$ ring, 100 mTorr, 50 Watts, 300° C. substrate temperature, and 30 s time duration. Here as before, the atomic hydrogen reacts with the residual contaminants on the substrate to form volatile compounds and leave the surface. Without these effective hydrogen cleaning procedures, none of the epitaxial work would be possible. As with the epitaxial growth, it is the flux of particular selected species from the excitation region to the substrate that is the key to these processes.

Following use of the cleaning procedure and before limitation of the epitaxial growth process it is very important to prevent re-contamination of the substrate surface by undersirable gas species which constitute the background or "base" pressure of the growth apparatus. These contaminants can impinge the substrate from a variety of sources including the several surfaces present in the growth apparatus. Therefore, it is very important to minimize the concentration of these contaminant species in the apparatus through maintaining a very low base pressure, less than $5 \times 10^{10}$ Torr. Base pressures larger than this value, through contamination and disruption of the crystalline order of the cleaned substrate surface, will significantly degrade the quality of the epitaxial grown layer For example, at a base pressure of $5\times10^{-10}$ Torr, 10 percent of the substrate surface, will be covered with new contaminants after only 4 minutes. Yet, a 10 percent surface contamination will create an unacceptably large crystalline point defect density between $10^{20}$ and $10^{21}$ in the epitaxial layer. Consequently, the requirement of base pressure less than $5\times10^{-10}$ Torr is a minimum requirement.

The invention has been shown in what is considered to be the most practical and preferred embodiments. It is recognized, however, that obvious modifications may occur to those with skill in this art. Accordingly, the scope of the invention is to be discerned solely by reference to the appended claims.

WHAT IS CLAIMED AND DESIRED TO BE SECURED BY LETTERS PATENT OF THE UNITED STATES IS:

1. An FET device comprising one or more FET stages, each stage of said one or more stages comprising:
   a channel, a source, a gate and a drain formed in a single monolith;
   said each stage comprising an input portion comprised of said source and said gate, an output portion comprised of said drain and said gate, said input and said output portions having mirror image geometry with respect to one another;
   said mirror image geometry and the forming of said input portion and said output portion from said single monolith, being effective to make the phase velocity of electromagnetic signals propagating in said input portion and said output portion virtually identical; and
   said channel of said each stage is a diamond layer in said monolith.

2. An FET device comprising one or more FET stages, each stage of said one or more stages comprising:
   a channel, a source, a gate and a drain formed in a single monolith;
   said each stage comprising an input portion comprised of said source and said gate, an output portion comprised of said drain and said gate, said input and said output portions having mirror image geometry with respect to one another;
   said mirror image geometry and the forming of said input portion and said output portion from said single monolith, being effective to make the phase velocity of electromagnetic signals propagating in said input portion and said output portion virtually identical;
   said channel of said each stage is a diamond layer in said monolith;
   wherein said device comprises a layer of boron nitride disposed between said diamond layer and said gate in said each stage, said diamond layer and said layer of boron nitride being heteroepitaxial with one another.

3. The device of claim 2 wherein said device comprises a insulating diamond substrate disposed adjacent to said layer of boron nitride and on the face of said layer of boron nitride opposite said diamond layer, and wherein said each gate is produced by the process comprising the steps of:
   etching a gate trench in said diamond substrate;
   allowing the difference in etchability between boron nitride and diamond to stop said etching at said layer of boron nitride, effective to expose a portion of said boron nitride;
   placing metal in said trench, said metal being in abutting contact, and electrical contact, with said portion of said boron nitride exposed by said etching.

4. The device of claim 3 wherein said one or more stages is a plurality of stages formed in said single monolith and integrally yoked together source to drain, and wherein, for said each stage of said plurality of stages, adjacent said sources and drains of sequential stages of said plurality of stages are unitary.

5. An FET device comprising one or more FET stages, each stage of said one or more stages comprising:
   a channel, a source, a gate and a drain formed in a single monolith;
   said each stage comprising an input portion comprised of said source and said gate, an output portion comprised of said drain and said gate, said input and said output portions having mirror image geometry with respect to one another;
   said mirror image geometry and the forming of said input portion and said output portion from said single monolith, being effective to make the phase velocity of electromagnetic signals of wavelength smaller than about one millimeter propagating in said input portion and said output portion virtually identical; and
   said channel of said each stage is a diamond layer in said monolith.

* * * * *